(12) United States Patent
Chern

(10) Patent No.: US 10,971,595 B2
(45) Date of Patent: Apr. 6, 2021

(54) MOFSET AND METHOD OF FABRICATING SAME

(71) Applicant: Nexchip Semiconductor Corporation, Anhui (CN)

(72) Inventor: Geeng-Chuan Chern, Anhui (CN)

(73) Assignee: Nexchip Seminconductor Corporation, Anhui (CN)

( * ) Notice: Subject to any disclaimer, the term of this patent is extended or adjusted under 35 U.S.C. 154(b) by 50 days.

(21) Appl. No.: 16/222,022

(22) Filed: Dec. 17, 2018

(65) Prior Publication Data

US 2020/0127108 A1 Apr. 23, 2020

(30) Foreign Application Priority Data

Oct. 23, 2018 (CN) .......................... 201811237197.5

(51) Int. Cl.

| | |
|---|---|
| H01L 29/49 | (2006.01) |
| H01L 29/78 | (2006.01) |
| H01L 29/66 | (2006.01) |
| H01L 21/266 | (2006.01) |
| H01L 21/28 | (2006.01) |
| H01L 21/265 | (2006.01) |

(52) U.S. Cl.
CPC ........ *H01L 29/4983* (2013.01); *H01L 21/266* (2013.01); *H01L 21/2652* (2013.01); *H01L 21/28105* (2013.01); *H01L 29/66492* (2013.01); *H01L 29/66568* (2013.01); *H01L 29/7833* (2013.01)

(58) Field of Classification Search
CPC ............. H01L 29/4983; H01L 29/6659; H01L 29/665; H01L 29/66492; H01L 29/66575; H01L 29/66568; H01L 21/28105; H01L 21/28123; H01L 21/266; H01L 21/2652
See application file for complete search history.

(56) References Cited

U.S. PATENT DOCUMENTS

| | | | |
|---|---|---|---|
| 5,998,848 A | 12/1999 | Brown et al. | |
| 6,498,085 B2 * | 12/2002 | Jung ................ | H01L 21/28123 257/E21.206 |
| 2008/0122007 A1 * | 5/2008 | Kawai ............ | H01L 21/823842 257/374 |
| 2009/0294848 A1 * | 12/2009 | Chang ............... | H01L 29/7836 257/335 |

\* cited by examiner

*Primary Examiner* — Michael M Trinh
(74) *Attorney, Agent, or Firm* — Muncy, Geissler, Olds & Lowe, P.C.

(57) ABSTRACT

A metal-oxide-semiconductor field-effect transistor (MOSFET) and a method for fabricating the MOSFET are disclosed. In the method, after a gate is formed by etching a deposited undoped or lightly-doped polysilicon layer, with the portions of the gate above channel edge between a channel region and STI region being protected, ions are doped into the remaining gate portion during source/drain implantation. As a result, each of the gate portions above channel edge is constructed of a doped second polysilicon layer stacked with undoped (or lightly-doped) first polysilicon layers, while the remaining gate portion is simply constituted by the doped second polysilicon layer. This can increase a threshold voltage of the MOSFET at channel edge. Optionally, before the gate is formed by etching the polysilicon, the portions of the polysilicon above the channel edge may be protected, followed by doping ions into the remaining portions of the polysilicon.

5 Claims, 14 Drawing Sheets

MOFSET AND METHOD OF FABRICATING SAME

CROSS-REFERENCE TO RELATED APPLICATION

This application claims the priority of Chinese patent application number 201811237197.5, filed on Oct. 23, 2018, the entire contents of which are incorporated herein by reference.

TECHNICAL FIELD

The present invention relates to the fabrication of integrated circuits (ICs) and, in particular, to a metal-oxide-semiconductor field-effect transistor (MOSFET) and a method for fabricating the MOSFET.

BACKGROUND

Metal-oxide-semiconductor field-effect transistors (MOSFETs) are one of basic electronic components found on integrated circuits (ICs). A MOSFET is usually composed of a source region, a drain region, a gate and a substrate, in which the source and drain regions, along with a channel region between them, together constitute an effective working area of the MOSFET, commonly referred to as an active area. The active area is typically isolated from adjacent device regions by shallow trench isolation (STI) regions. The gate is formed over the channel region, and the source and drain regions are located on both sides of the gate. With critical dimensions of IC features continuing to shrink, the electrical properties of active corners covered by the gate (i.e., interfaces of the channel region with the STI region) are becoming increasingly important and have a great impact on the device's performance.

It has been found that, due to corner effects, portions of a gate dielectric layer around the active corners covered by the gate is thinner, thus leading to an enhanced electric field between the channel and the gate. As a result, a threshold voltage of the channel is lower at the active corners than in the central region between these corners. This lower threshold voltage provides a parallel path for current conduction, which may deteriorate current leakage at the active corners covered by the gate and thus degrade the device's performance and reliability. U.S. Pat. No. 5,998,848 discloses a field-effect transistor (FET) and method for fabricating the FET, in which, with reference to FIGS. 1a to 1c, a gate doped with a P- or N-type dopant (i.e., a polycrystalline silicon (polysilicon) gate layer) 30 is formed over a channel region, and the regions of the gate 30 above the active corners are counterdoped to deplete the previously-doped dopant in those regions, thereby forming dopant-depleted gate regions (or depleted regions for short) 34. As these depleted regions 34 have a lower degree of doping, effective gate oxide thickness above the active corners is increased, resulting in an increase in the threshold voltage at the active corners. However, this solution still suffers from the following drawbacks:

1. In this solution, the formation of the depleted regions 34 requires counter doping the regions of the polysilicon gate layer above the active corners, necessitating an additional masking step for shielding and protecting the rest of the polysilicon gate layer while leaving portions of the polysilicon gate layer to be doped exposed. This leads to increased process complexity.

2. A conventional IC fabrication process typically produces a polysilicon gate 30 thicker than or as thick as a depth of the source/drain junction. In this solution, for effective formation of the depleted regions 34, the counterdoping depth must be greater than a thickness of the polysilicon gate 30 so as to form another depleted region near the interface of the gate 30 and the gate dielectric layer 32. In other words, the counter doping depth is typically greater than the source/drain junction depth. As such, when the type of the counter doping ions is opposite to that of the doping ions in the source and drain regions, any misalignment of the mask used for the counterdoping will lead to the formation of an oppositely-doped region 36 in the vicinity of the source or the drain, which may cause a short circuit or a current leakage. For example, with a counterdoping dose of $5 \times 10^{14}/cm^2$ and a dopant dose of $10^{15}/cm^2$ in the source/drain regions, a high-concentration PN junction, tending to cause a current leakage, will be formed between the oppositely-doped region 36 and the corresponding source or drain. Therefore, the counterdoping process in this solution does not allow misalignment or dimensional tolerances, making the solution barely suitable for practical fabrication.

Therefore, there is a need for a MOSFET and a method for fabricating the MOSFET, which can increase the threshold voltage at the active corners covered by the gate, enhance the reliability of the resulting device, reduce a process complexity and be suitably used in practical fabrication.

SUMMARY OF THE INVENTION

It is just an object of the present invention to provide such a MOSFET and a fabrication method, which can increase the threshold voltage at the active corners covered by the gate, enhance the reliability of the resulting device, reduce a process complexity and be suitably used in practical fabrication.

To this end, the MOSFET provided in the present invention comprises:

a substrate;

a shallow trench isolation (STI) region formed in the substrate;

an active area, formed in the substrate and delimited by the STI region, the active area comprising a source region, a drain region and a channel region located between the source and drain regions; and a gate formed over the channel region, the gate comprising a first polysilicon layer and a second polysilicon layer, the first polysilicon layer being a layer of undoped polysilicon, lightly-doped polysilicon or a combination thereof, the first polysilicon layer covering an channel edge between the channel region and the STI region such that the first polysilicon layer covers a first portion of the channel region and a part of the STI region, the second polysilicon layer being a layer of doped polysilicon that covers the first polysilicon layer and a second portion the channel region not covered by the first polysilicon layer, the lightly-doped polysilicon being implanted with ions of a same conductivity type as ions implanted in the second polysilicon layer as well as in the source and drain regions.

Optionally, the channel edge may have a width ranging from 0.8 T to 1.6 T, where T denotes a total deposition thickness of the polysilicon layers in the gate.

Optionally, the gate may be isolated from the channel region by a gate dielectric layer.

Optionally, in the substrate, there may also be lightly-doped drain (LDD) regions situated on the sides of the source and drain regions proximate the channel region.

Optionally, metal silicide layers may be formed on respective surfaces of the gate, the source region and the drain region.

The present invention also provides a method of fabricating a MOSFET, comprising:

providing a substrate and forming therein STI region that delimits an active area containing a channel region;

successively forming a gate dielectric layer and a polysilicon layer over both the STI region and the active area, wherein the polysilicon layer is a layer of undoped polysilicon, lightly-doped polysilicon or a combination thereof;

defining a portion of the polysilicon layer above channel edge between the channel region and the STI region as a first polysilicon layer and a remaining portions of the polysilicon layer as a second polysilicon layer, forming a gate by masking at least portions of the first and second polysilicon layers located above the channel region, and etching away the unmasked portions of the first and second polysilicon layers; and masking each portion of the gate above the channel edge and performing a source/drain (S/D) implantation on both the unmasked portion of the gate and portions of the active area on both sides of the gate to form source and drain regions, wherein ions implanted to form the source and drain regions are of the same conductivity type as those in the lightly-doped polysilicon, and wherein the first polysilicon layer in the gate is partially unaffected by the S/D implantation while the second polysilicon layer is entirely converted into a polysilicon layer doped with ions implanted in the S/D implantation.

Optionally, before the gate is formed by etching the polysilicon layer, the first polysilicon layer above the channel edge between the channel region and the STI region may be masked, followed by implantation of ions into the second polysilicon layer, so that the second polysilicon layer is converted into a doped polysilicon layer, with a partial thickness of the first polysilicon layer above the channel edge remaining unaffected by the implanted ions.

Optionally, the channel edge may have a width ranging from 0.8 T to 1.6 T, where T denotes a deposition thickness of the polysilicon layer.

Optionally, masking the portions of the gate above the channel edge may comprise masking the portion of the gate above the channel edge with a patterned mask layer in such a manner that the patterned mask layer is precisely aligned with the channel edge, or that the patterned mask layer covers the entire channel edge and also extends over a portion of the active area adjacent the channel edge, or that the patterned mask layer covers a portion of the channel edge and a portion of the active area adjacent the channel edge, wherein the patterned mask layer is removed after the S/D implantation has been completed.

Optionally, ions implanted inside the polysilicon layer may laterally diffuse into the polysilicon layer above the channel edge from both sides of the channel edge by a distance equal to 0.8 T, where T denotes a deposition thickness of the polysilicon layer.

Optionally, masking the first polysilicon layers before the gate is formed by etching the polysilicon layer may comprise masking the first polysilicon layers above the channel edge with a patterned mask layer in such a manner that the patterned mask layer is precisely aligned with the channel edge, or that the patterned mask layer covers the entire channel edge and also extends over a portion of the active area adjacent the channel edge, or that the patterned mask layer covers a portion of the channel edge and a portion of the active area adjacent the channel edge, wherein the patterned mask layer is removed after the implantation of the ions has been completed.

Optionally, after the gate is formed, and before the portions of the gate above the channel edge is masked, lightly-doped drain (LDD) regions are formed in the active area on both sides of the gate by implanting ions of a same conductivity type as the implanted ions in the source region.

Optionally, subsequent to the formation of the LDD regions, and prior to the formation of the source and drain regions, spacers may be formed on side walls of the gate.

Optionally, subsequent to the formation of the source and drain regions, metal silicides may be formed on respective surfaces of the gate, the source region and the drain region.

Compared to the prior art, the present invention offers the following advantages:

1. The MOSFET of the present invention can be easily fabricated, in which each of the gate portions above the channel edge (i.e., the channel edge) is constructed of the second polysilicon layer stacked with the first polysilicon layer, while the rest gate portion is simply constituted by the second polysilicon layer. In addition, the first polysilicon layer is a layer of undoped polysilicon, lightly-doped polysilicon or a combination thereof, while the second polysilicon layer is a layer of more highly doped polysilicon. Further, the second polysilicon layer is implanted with ions of the same conductivity type as ions implanted in the source/drain regions. As such, on the one hand, the gate has a higher conductivity resulting from the more highly doped second polysilicon layer, and on the other hand, the undoped polysilicon or lightly-doped polysilicon above the channel edge has a lower degree of doping, which allows the resulting MOSFET to have an increased threshold voltage at the channel edge (i.e., the interface between the channel region and the STI region). With such an increased threshold voltage at the channel edge, a premature conduction of the device can be avoided, making the device more reliable.

2. In the method of the present invention, after the gate is formed by etching the deposited undoped or lightly-doped polysilicon layer, with the portions of the gate above the channel edge between the channel region and the STI region being protected, ions are implanted into the rest portion of the gate. In this way, each of the gate portions above the channel edge is constructed of the doped second polysilicon layer stacked with a corresponding one of the undoped (or lightly-doped) first polysilicon layer, while the rest gate portion is simply constituted by the doped second polysilicon layer. This can increase the threshold voltage of the MOSFET at the channel edge. Optionally, before the gate is formed by etching the polysilicon, the portions of the polysilicon above the channel edge may be protected, followed by implanting ions into the rest of the polysilicon.

3. In the method of the present invention, undoped or lightly-doped gate polysilicon portions above the channel edge between the channel region and the STI region, which can increase the threshold voltage (Vth) of the MOSFET at the channel edge, can be formed simply by shielding these portions while exposing the rest portion of the gate for doping by just modifying the mask for the polysilicon layers, without needing additional counterdoping and masking steps. This makes it possible to manufacture the MOSFET by a simple process. In addition, as counterdoping is not involved, the doping processes performed on the rest portion of the gate can accommodate misalignment and size variations (e.g., expansions of the mask features covering the channel edge between the channel and STI regions). Furthermore, the non-involvement of counterdoping can avoid forming, around the source or drain region due to misalignment, an undesired PN junction that may cause a short circuit or a current leakage.

Figure 1A:
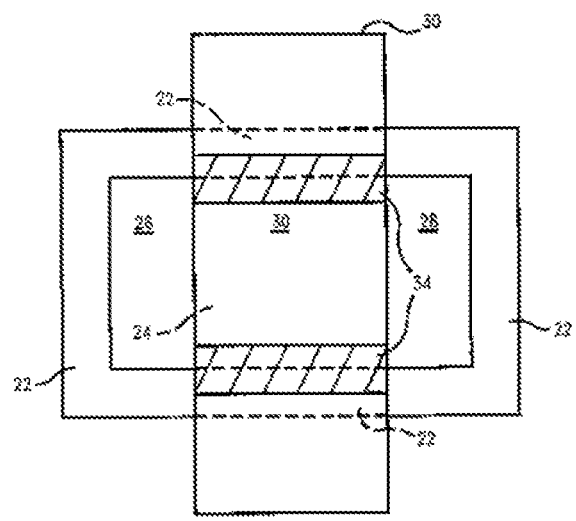
FIG. 1a is a schematic top view of a conventional MOSFET (with aligned dopant-depleted gate regions).
Figure 1B:
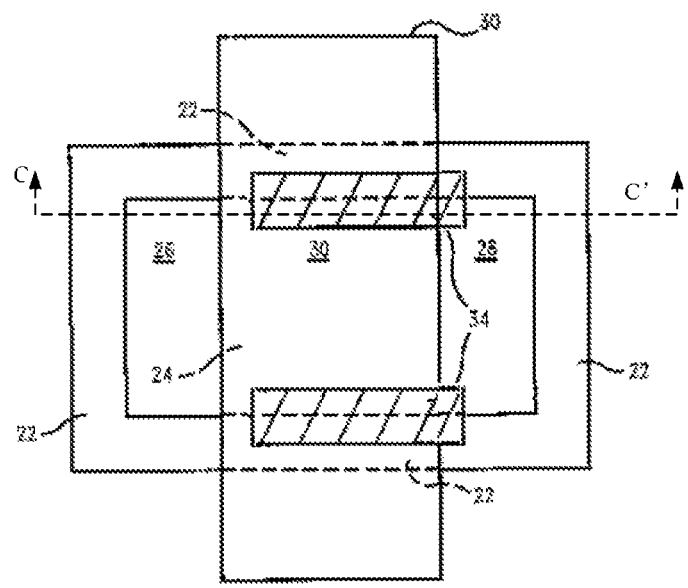
FIG. 1b is a schematic top view of a conventional MOSFET (with misaligned dopant-depleted gate regions).
Figure 1C:
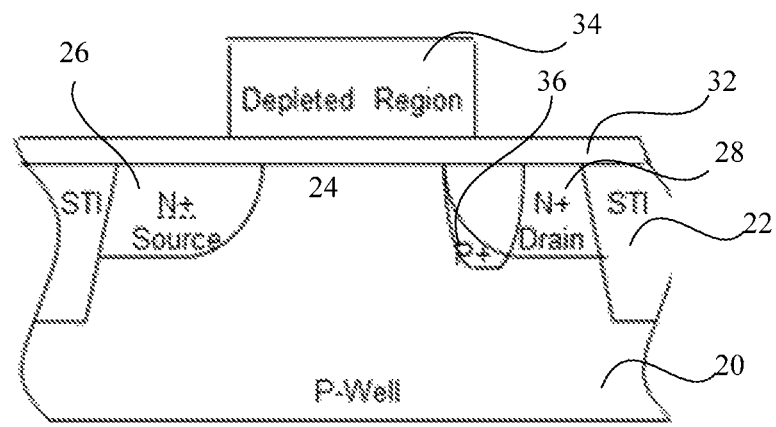
FIG. 1c is a schematic cross-sectional view taken along line CC' in FIG. 1b.

LIST OF REFERENCE NUMERALS 20, 100 substrate
100a active area
100b lightly-doped drain (LDD) region
26, 100s source region
28, 100d drain region
100c channel region
100e channel edge between channel region and STI region
22, 101 STI region
102 gate dielectric layer
103 polysilicon layer (undoped or lightly doped polysilicon)
103a ion-implanted region in polysilicon layer 103
103b undoped polysilicon portions above channel edge
103c second polysilicon layer (doped polysilicon)
103d first polysilicon layer (undoped or lightly doped polysilicon)
30, 103e gate
104 first patterned mask layer (photoresist 1)
105 second patterned mask layer (photoresist 2)
106 third patterned mask layer (photoresist 3)
107 spacer
108 self-aligned silicide (salicide)
34 dopant-depleted gate region
36 counterdoped region
T thickness of polysilicon layer 103
D width of channel edge 100e, namely, covering width of first patterned mask layer 104
L lateral diffusion width of implanted ions diffused into channel edge 100e from both sides channel edge
D1 lateral width of first polysilicon layer 103d after ion implantation and annealing
D2 lateral width of first polysilicon layer 103d after S/D ion implantation and annealing

DETAILED DESCRIPTION

The subject matter of the present invention will be described in further detail below with reference to a particular embodiment and to accompanying FIGS. 2a to 2c, 3, 4a to 4b, 5a to 5b, 6a to 6b, 7a to 7b, 8a to 8b, 9a to 9b, 10a to 10c, 11a to 11c, 12a to 12b, 13a to 13b, 14a to 14b, 15a to 15b and 16a to 16b. Features and advantages of the invention will be more apparent from the following detailed description. It is noted that the figures are provided in a very simplified form and not necessarily drawn to scale, with the only intention to facilitate convenience and clarity in explaining the embodiment. Additionally, it will be readily appreciated that, as used herein, the terms "above" and "over" should be construed in its broadest sense to mean "being directly on an object" without an intervening feature or layer or "overlying an object" with one or more intervening features or layers. Moreover, as used herein, "channel edge" denotes a region extending along an interface between a channel region and an STI region, the region including both part of the channel region and part of the STI region; "first polysilicon layer", undoped or lightly-doped polysilicon unaffected either by the ion implantation in step S2 or by the S/D implantation in step S5; "second polysilicon layer", polysilicon doped both by the ion implantation in step S2 and by the S/D implantation in step S5; the portions of the gate, polysilicon layer and second polysilicon layer "located out of the channel edge" refer to the portions of the gate, polysilicon layer and second polysilicon layer other than the portions above the channel edge; and the portions of the gate, polysilicon layer and second polysilicon layer "located in the channel edge" or "located over the channel edge" refer to the portions of the gate, polysilicon layer and second polysilicon layer located right above and covering the channel edge.

Figure 2A:
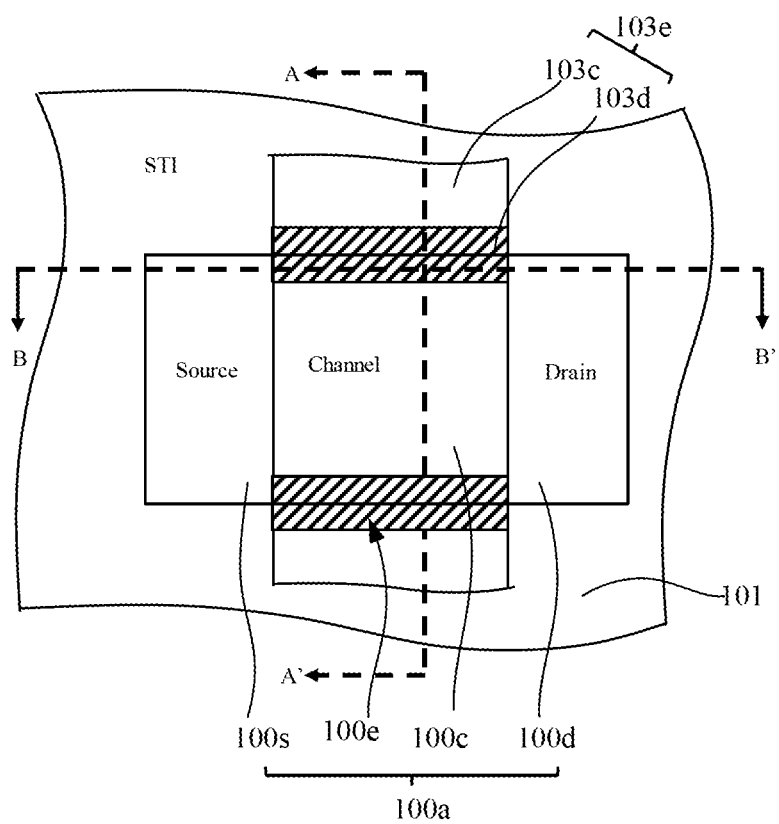
FIG. 2a is a schematic top view of a MOSFET according to a particular embodiment of the present invention.
Figure 2B:
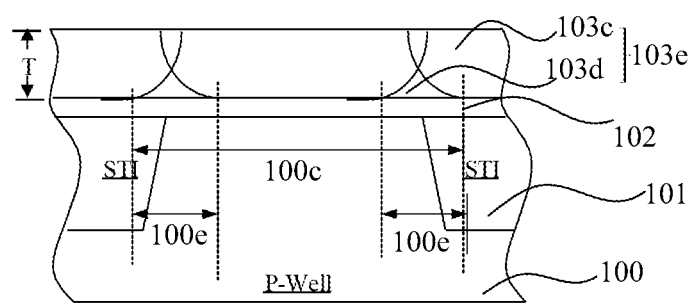
FIGS. 2b and 2c are schematic cross-sectional views of the MOSFET taken along lines AA' and BB' in FIG. 2a, respectively.

FIG. 2a is a schematic top view of a MOSFET according to an embodiment of the present invention. FIG. 2b is a schematic cross-sectional view taken along line AA' of FIG. 2a, while FIG. 2c is a schematic cross-sectional view taken along line BB' of FIG. 2a.

Figure 2C:
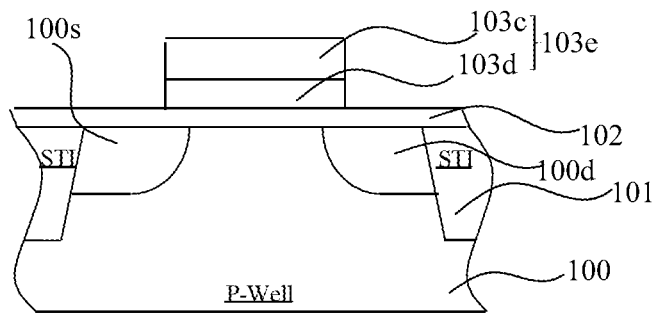

Referring to FIGS. 2a to 2c, the MOSFET includes a substrate 100, an STI region 101, an active area 100a and a gate 103e.

The substrate 100 may be any substrate well known to those skilled in the art for carrying semiconductor IC components, such as a die or a wafer that has undergone epitaxial growth processes. For example, the substrate 100 may be a silicon-on-insulator (SOI) substrate, a bulk silicon substrate, a germanium substrate, a silicon-germanium (SiGe) substrate, an indium phosphide (InP) substrate, a gallium arsenide (GaAs) substrate, a germanium-on-insulator (GOI) substrate or the like.

The STI region 101 may be formed in the substrate 100 by a shallow trench isolation (STI) technique. The active area 100a is a portion of the substrate 100 delimited by the STI regions 101, in which the MOSFET is to be fabricated. The active area includes a source region 100s, a drain region 100d and a channel region 100c located between the source region 100s and the drain region 100d.

The gate 103e is formed over the channel region 100c, with the source region 100s and the drain region 100d located on opposing sides of the gate 103e. The gate 103e may be isolated from the channel region 100c by a gate dielectric layer 102.

The gate 103e includes a first polysilicon layer 103d and a second polysilicon 103c. The first polysilicon layer 103d may be a layer of undoped polysilicon, lightly-doped polysilicon or a combination thereof that cover respective channel edge 100e between the channel region 100c and the STI region 101, and the first polysilicon layer 103d overlaps part of the channel region 100c and part of the STI region 101. The second polysilicon layer 103c is a layer of doped polysilicon that covers the first polysilicon layer 103d and a portion of the channel region 100c exposed out of the first polysilicon layer 103d. Additionally, the second polysilicon layer 103c is implanted with ions of the same conductivity type as ions implanted in the source region 100s and the drain region 100d. Each of the channel edge 100e may have a width ranging from 0.8 T to 1.6 T, where T denotes a total deposition thickness of the polysilicon layers in the gate, i.e., the thickness of the second polysilicon layer 103c above the other portion of the channel region 100c than the channel edge 100e, as shown in FIGS. 2b and 2c. T may be, for example, in the range of 100 nm to 500 nm.

In case the first polysilicon layer 103d is a lightly-doped polysilicon, it may be implanted with ions of the same conductivity type as ions implanted in the second polysilicon layer 103c, the source region 100s and the drain region 100d. Moreover, a concentration of the ions implanted in the lightly-doped polysilicon may be lower than a concentration of the ions implanted in the second polysilicon layer 103c. For example, the lightly-doped polysilicon may be implanted with a dose of implanted ions ranging from $1\times10^{12}/cm^2$ to $10\times10^{12}/cm^2$ and the second polysilicon layer 103c with a dose of implanted ions ranging from $1.5\times10^{15}/cm^2$ to $10\times10^{15}/cm^2$.

The higher concentration of ions in the second polysilicon layer 103c of the gate 103e can impart increased conductivity to the gate 103e. At the same time, as the first polysilicon layers 103d over the channel edge 100e are undoped or lightly-doped polysilicon, they may form depleted polysilicon regions of the gate 103e which increase a threshold voltage (Vth) of the channel region 100c at its portions under the depleted polysilicon regions.

It is to be noted that, when connecting with those of neighboring MOSFETs to form a gate line, the gate 103e of the MOSFET may extend from above the channel region 100c to above the STI region 101.

Figure 16A:
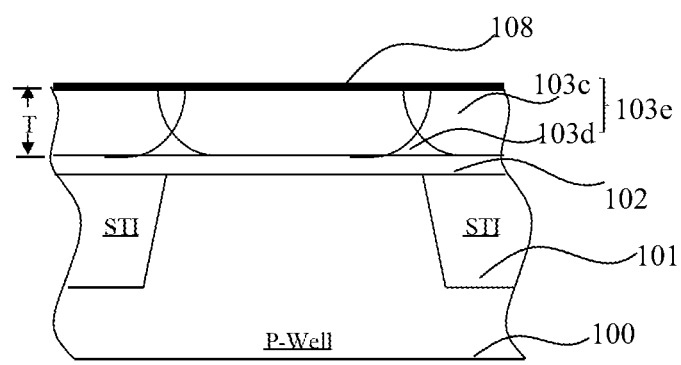
FIGS. 16a and 16b are schematic cross-sectional views of a structure resulting from the formation of metal silicides according to another alternative embodiment of the method taken along lines AA' and BB' in FIG. 2a, respectively.
Figure 16B:
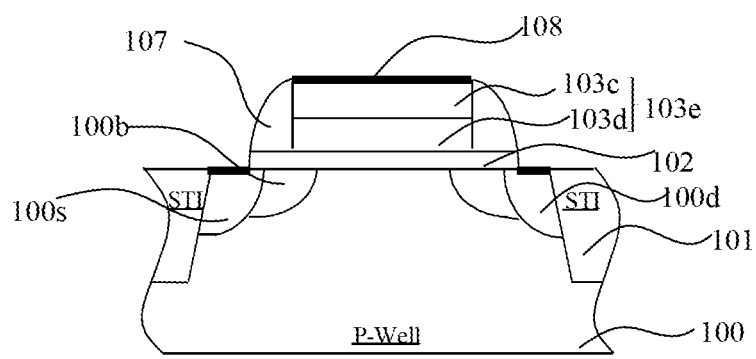

Referring to FIG. 16b, the MOSFET may further comprise: an LDD region 100b in the active area 100a next to each of the source region 100s and the drain region 100d, the LDD region 100b located on a side of the source or drain region closer to the gate 103e; spacers 107 on respective lateral sides of the gate 103e; and self-aligned metal silicide (salicide) layers 108 respectively formed on surfaces of the second polysilicon layer 103c of the gate 103e, the source region 100s and the drain region 100d.

The MOSFET can be easily fabricated, in which each of the gate portions above the channel edge is constructed of the second polysilicon layer stacked with a corresponding one of the first polysilicon layers, while the rest gate portion is simply constituted by the second polysilicon layer. In addition, the first polysilicon layer is a layer of undoped polysilicon, lightly-doped polysilicon or a combination thereof, while the second polysilicon layer is a layer of more highly doped polysilicon. Further, the second polysilicon layer is implanted with ions of the same conductivity type as ions implanted in the source/drain regions. As such, on the one hand, the gate has a higher conductivity resulting from the more highly doped second polysilicon layer, and on the other hand, the undoped polysilicon or lightly-doped polysilicon above the channel edge forms depleted polysilicon regions which allow the resulting MOSFET to have an increased threshold voltage at the channel edge (i.e., the channel-STI interfaces) and hence an improved reliability.

Figure 3:
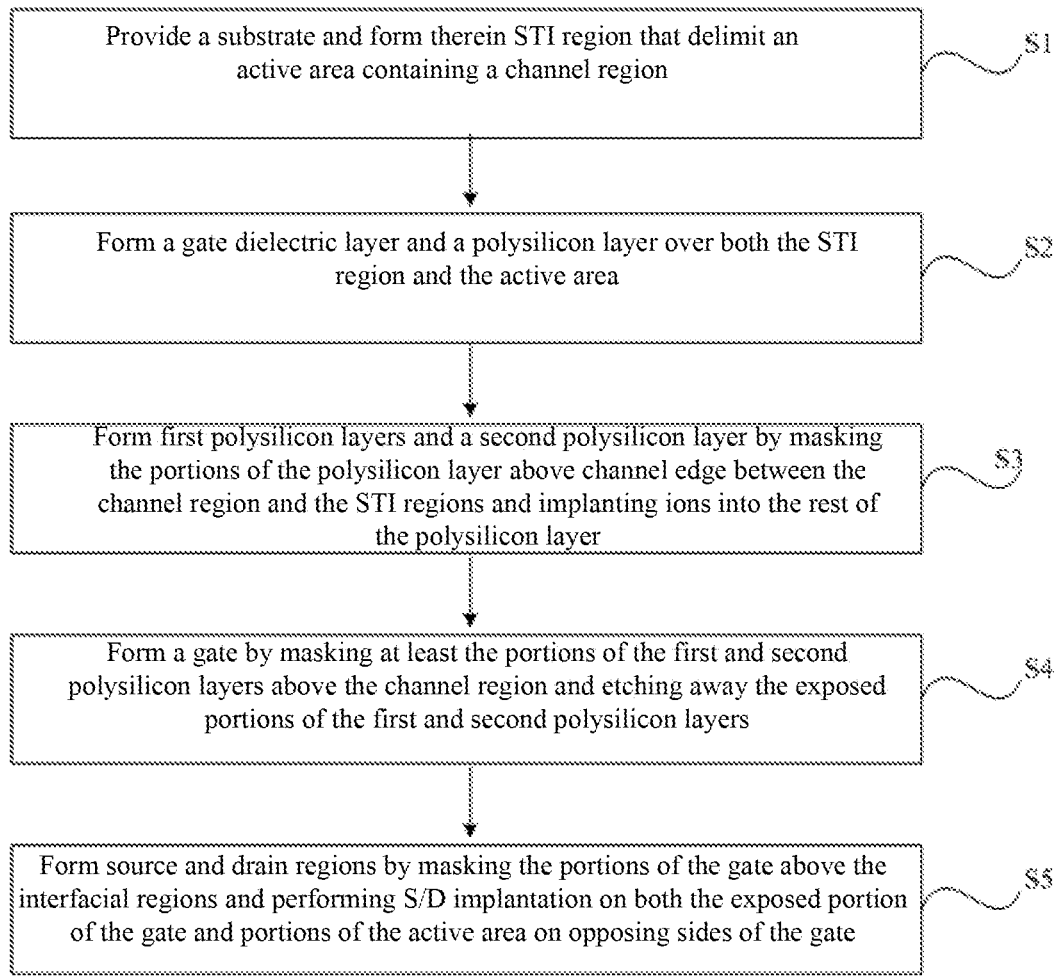
FIG. 3 is a flowchart of a method for fabricating a MOSFET according to an embodiment of the present invention.

Referring to FIG. 3, a method for fabricating a MOSFET according to this embodiment includes the steps of:

S1: providing a substrate and forming therein an STI region that delimits an active area containing a channel region;

S2: successively forming a gate dielectric layer and a polysilicon layer over both the STI region and the active area, wherein the polysilicon layer is a layer of undoped polysilicon, lightly-doped polysilicon or a combination thereof;

S3: (optional) masking the portions of the polysilicon layer above channel edge between the channel region and the STI region and implanting ions into the remaining portion of the polysilicon layer so that at least partial thicknesses of the masked portions of the polysilicon layer above the channel edge are not affected by the implanted ions and are defined as a first polysilicon layer, with the remaining portion of the polysilicon layer, i.e., the doped portion of polysilicon layer, being defined as a second polysilicon layer;

S4: masking at least the portions of the first and second polysilicon layers above the channel region and etching away their remaining portions to form a gate; and S5: masking the portions of the gate above the channel edge and performing source/drain (S/D) implantation on both the exposed portion of the gate and portions of the active area on opposing sides of the gate to form source and drain regions, wherein the ions implanted to form the source/drain regions are of the same conductivity type as the ions implanted in the second polysilicon layer, and the first polysilicon layer is partially converted into the second polysilicon layer and partially remains.

Figure 4A:
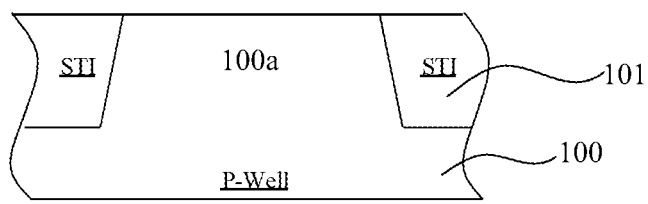
FIGS. 4a and 4b are schematic cross-sectional views of a structure resulting from step S1 in the method taken along lines AA' and BB' in FIG. 2a, respectively.
Figure 4B:
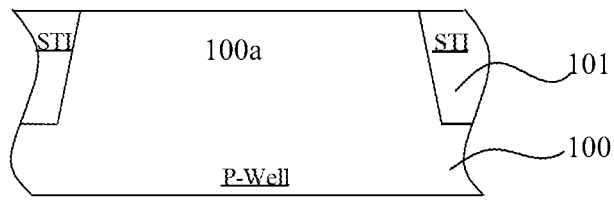

FIG. 4a is a schematic cross-sectional view of a structure resulting from step S1 in the above method taken along line AA' in FIG. 2a, while FIG. 4b is a schematic cross-sectional view of this structure taken along line BB' in FIG. 2a.

Referring to FIGS. 4a and 4b, in step S1, the STI regions 101 and the active area 100a are formed in the substrate 100.

Specifically, providing a substrate 100 which provides a platform on which the subsequent processes are carried out. It may be any substrate well known to those skilled in the art for carrying semiconductor IC components, such as a die or a wafer that has undergone epitaxial growth processes. For example, the substrate 100 may be a silicon-on-insulator (SOI) substrate, a bulk silicon substrate, germanium substrate, a silicon-germanium (SiGe) substrate, an indium phosphide (InP) substrate, a gallium arsenide (GaAs) substrate, a germanium-on-insulator (GOI) substrate or the like. For example, the substrate 100 may have a flat surface. It may also have a well (e.g., the P-well of FIG. 4a) typically doped with ions of an opposite conductivity type to that of ions doped in the subsequently-formed source region 100s and drain region 100d. That is, if the MOSFET being fabricated is a PMOSFET, the well thereunder will be an N-well, and if the MOSFET is an NMOSFET, the well will be a P-well.

Subsequently, the STI region 101 is formed in the substrate 100 to delimit the active area 100a in which the source region 100s, the drain region 100d and the channel region 100c between the source and drain regions, of the MOSFET, will be subsequently formed. In this embodiment, the active area 100a may be a rectangular region surrounded by the STI region 101. Specifically, the STI region 101 may be typically formed by a process including the steps of: forming a buffer oxide layer such as, e.g., silica ($SiO_2$), on the substrate 100; depositing a nitride layer such as, e.g., silicon nitride ($Si_3N_4$), on the buffer oxide layer; etching the substrate 100 with the buffer oxide and nitride layers to form therein shallow trenches; filling the shallow trenches with an insulating dielectric (e.g., $SiO_2$); planarizing the top surface of the substrate by chemical mechanical polishing (CMP) to form the STI region (or STI structure) 101; and subsequent to the formation of the STI region 101, removing the buffer oxide and nitride layers. This process is commonly adopted in STI techniques and well known to those skilled in the art, and further details thereof will not be described herein for the sake of simplicity.

When directly forming the gate on the substrate 100, the electric field in the gate near the channel edge 100e (i.e., the channel edge between the channel region 100c and the STI regions 101) may be enhanced, leading to a reduction in the threshold voltage (Vth) of the channel at the channel edge compared to that in the rest of the channel, which is unfavorable to the performance of the device. For this reason, in the subsequent steps, the portions of the gate structure above the channel edge (i.e., the portions of the gate structure above the channel edge 100e between the channel region 100c and the STI region 101) will be changed to improve the threshold voltage (Vth) at the channel edge so as to enhance the performance of the device.

Figure 5A:
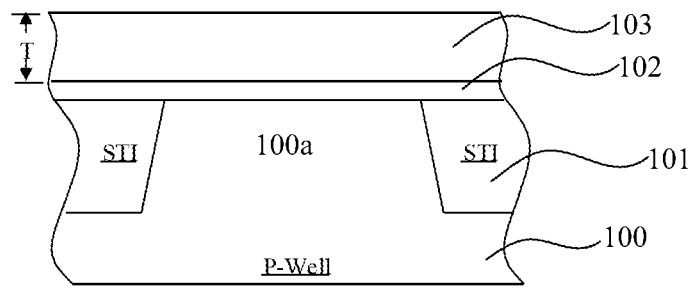
FIGS. 5a and 5b are schematic cross-sectional views of a structure resulting from step S2 in the method taken along lines AA' and BB' in FIG. 2a, respectively.
Figure 5B:
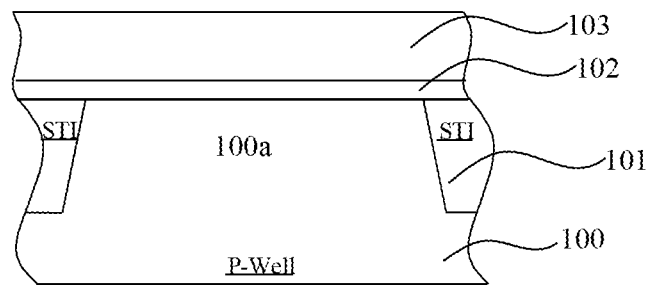

FIG. 5a is a schematic cross-sectional view of a structure resulting from step S2 in the above method taken along line AA' in FIG. 2a, while FIG. 5b is a schematic cross-sectional view of this structure taken along line BB' in FIG. 2a.

Referring to FIGS. 5a and 5b, in step S2, the gate dielectric layer 102 and the polysilicon layer (undoped or lightly-doped) 103 are successively formed over the surface of the substrate 100.

Specifically, a process such as thermal oxidation (either wet or dry), in-situ steam generation (ISSG), chemical vapor deposition (CVD) or atomic layer deposition may be performed to form the gate dielectric layer 102 globally over the surface of the substrate 100. The gate dielectric layer 102 may be silica ($SiO_2$), silicon oxynitride (SiON), silicon nitride (SiN), etc. and may have a thickness of 2 nm to 30 nm.

Next, a CVD process may be carried out to deposit, on the surface of the gate dielectric layer 102, undoped polysilicon as the polysilicon layer 103 that is to be processed to form the gate. Alternatively, an in-situ doping process may be performed to form lightly-doped polysilicon as the polysilicon layer 103. The polysilicon layer 103 may have a deposition thickness T ranging from 100 nm to 500 nm. Such a thickness range allows ions to be subsequently implanted into the polysilicon layer 103 to diffuse during an annealing process to an interface between the polysilicon layer 103 and the gate dielectric layer 102 and allows ions on opposing sides of each of the channel edge 100e to laterally diffuse into the channel edge 100e where they meet or cross each other. In other embodiments of the present invention, the polysilicon layer 103 may also be a composite structure composed of undoped polysilicon and lightly-doped polysilicon stacked one above the other.

Further, in case the polysilicon layer 103 is lightly-doped polysilicon, preferably, the implanted ions in the lightly-doped polysilicon are of the same conductivity type as ions subsequently implanted in the polysilicon layer 103 and of implanted ions in the subsequently formed source and drain regions. In addition, a concentration of the implanted ions in the lightly-doped polysilicon may be on the same order of magnitude as that of implanted ions in the LDD regions subsequently formed in the active area 100a. For example, the ions in the lightly-doped polysilicon may be implanted at a dose of $1\times10^{12}/cm^2$ to $10\times10^{12}/cm^2$.

Figure 6A:
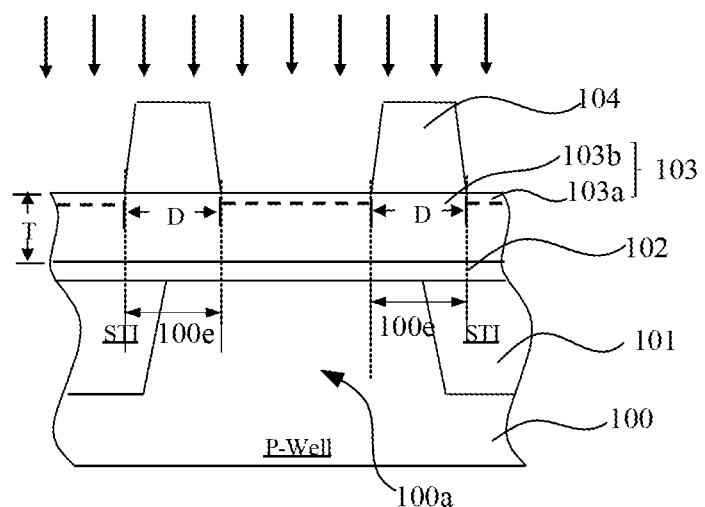
FIGS. 6a and 6b are schematic cross-sectional views of a structure resulting from ion implantation in step S3 in the method taken along lines AA' and BB' in FIG. 2a, respectively.
Figure 6B:
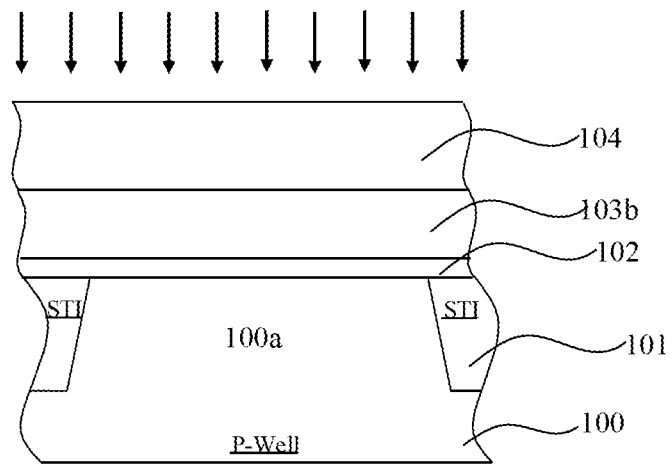
Figure 7A:
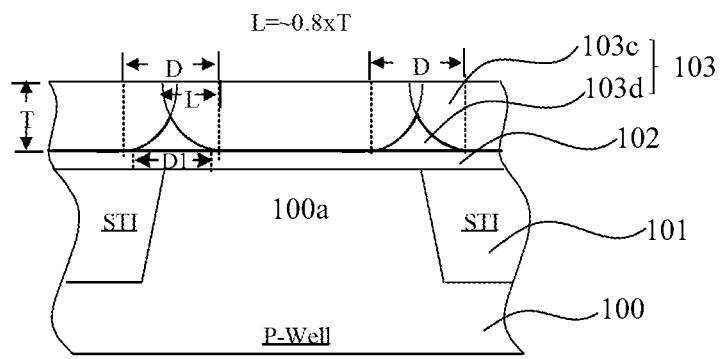
FIGS. 7a and 7b are schematic cross-sectional views of a structure resulting from annealing in step S3 in the method taken along lines AA' and BB' in FIG. 2a, respectively.
Figure 7B:
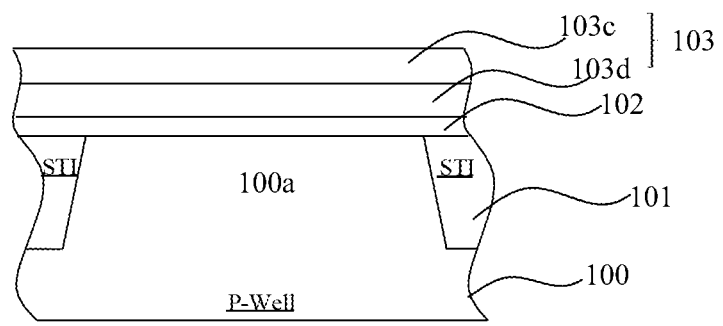

Polysilicon layer 103 resulting from step S2 covers the entire surface of the substrate 100. In other words, it covers both the STI region 101 and the active area 100a. FIGS. 6a and 7a are schematic cross-sectional views of structures respectively formed during and resulting from step S3 in the above method taken along line AA' in FIG. 2a, while FIGS. 6b and 7b are schematic cross-sectional views of the respective structures taken along line BB' in FIG. 2a. Step S3 is an optional step that may be either included or omitted.

Optionally, in step S3, the portions of the polysilicon layer 103 above the channel edge 100e are masked, and the rest thereof then undergoes an ion implantation process.

Specifically, referring to FIGS. 6a and 6b, a first patterned mask layer (photoresist 1) 104 may be formed over the polysilicon layer 103 to mask the portions of the polysilicon layer 103 above the channel edge 100e between the channel region and the STI region, with the rest of the polysilicon layer 103 remaining exposed. The material of the first patterned mask layer 104 may be photoresist, silicon nitride (SiN), silicon oxynitride (SiON) or a combination of two or more of them. In this embodiment, each of the channel edge 100e masked by the first patterned mask layer 104 extends along an interface of the active area 100a and the STI region 101 and consists of part of the active area 100a and part of the STI region 101. As per the schematic cross-sectional view taken along line AA' in FIG. 2a, each of the channel edge 100e may have a width D of from 0.8 T to 1.6 T, where T denotes the deposition thickness of the polysilicon layer 103.

With continued reference to FIGS. 6a and 6b, with the first patterned mask layer 104 serving as a mask, ions of the same conductivity type as ions subsequently implanted to form the source/drain regions are implanted into the exposed portion of the polysilicon layer 103. Herein, when the MOSFET being fabricated is an N-type MOSFET (or NMOSFET), the implanted ions are N-type ions (i.e., ions of the N-conductivity type) including, for example, at least one of phosphorus (P) ions, arsenic (As) ions and antimony (Sb) ions. When the MOSFET being fabricated is a P-type MOSFET (or PMOSFET), the implanted ions are P-type ions (i.e., ions of the P-conductivity type) including at least one of boron (B) ions, boron fluoride ($BF_2$) ions, gallium (Ga) ions and indium (In) ions. The ions may be implanted at an energy level of 10 Kev to 50 KeV and at a dose of $5 \times 10^{14}/cm^2$ to $5 \times 10^{15}/cm^2$. As a result, ion-implanted regions 103a will be formed in the polysilicon layer 103 between and on both sides of the channel edge 100e (as indicated by the dashed lines in FIGS. 6a and 6b). Moreover, the portions of the polysilicon layer 103 above the channel edge 100e are protected by the first patterned mask layer 104 and therefore not affected by the ion implantation process. Hereinafter, these portions are referred to as undoped polysilicon portions 103b (i.e., the undoped portions of the polysilicon layer).

Referring now to FIGS. 7a and 7b, subsequent to the above ion implantation process, the first patterned mask layer 104 is removed, optionally followed by an annealing process. Specifically, the first patterned mask layer 104 may be removed by a process properly selected based on material of the first patterned mask layer 104. After that, the polysilicon layer 103 containing the ion-implanted regions 103a may be annealing by performing a rapid thermal anneal (RTA) process or repeatedly heating the polysilicon layer in an oven in order to eliminate defects resulting from the ion implantation process and activate the doped ions.

During the annealing process, the implanted ions in the ion-implanted regions 103a will diffuse not only downward to the interface between the polysilicon layer 103 and the gate dielectric layer 102 but also laterally into the adjacent undoped polysilicon portions 103b above the channel edge 100e (i.e., the portions of the polysilicon layer 103 above the channel edge) where they meet or cross each other. As a result, upper portions of the undoped polysilicon portions 103b above the channel edge 100e become parts of the second polysilicon layer 103c containing the implanted ions, while their lower portions remain unaffected, i.e., free of the doped ions, form the first polysilicon layers 103d. In other words, the doped ions in the ion-implanted regions 103a diffuse downward a vertical distance that is equal to the deposition thickness T of the polysilicon layer 103 in step S2 and diffuse laterally into the channel edge 100e a horizontal distance that is not less than D/2, e.g., 0.8 T. Further, compared to the original undoped polysilicon portions 103b, the first polysilicon layers 103d may have a smaller bottom width D1, a smaller top width and a smaller thickness. Thus, after step S3, the portions of the polysilicon layer 103 immediately above the channel edge 100e are defined as the first polysilicon layers 103d, and the rest thereof as the second polysilicon layer 103c.

Figure 8A:
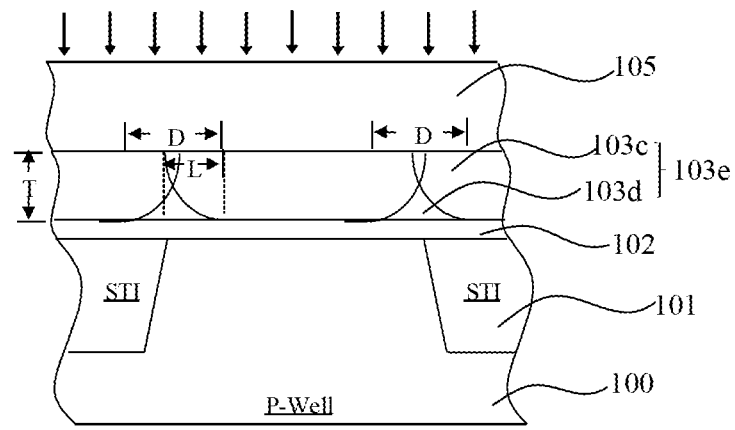
FIGS. 8a and 8b are schematic cross-sectional views of a structure resulting from step S4 in the method taken along lines AA' and BB' in FIG. 2a, respectively.
Figure 8B:
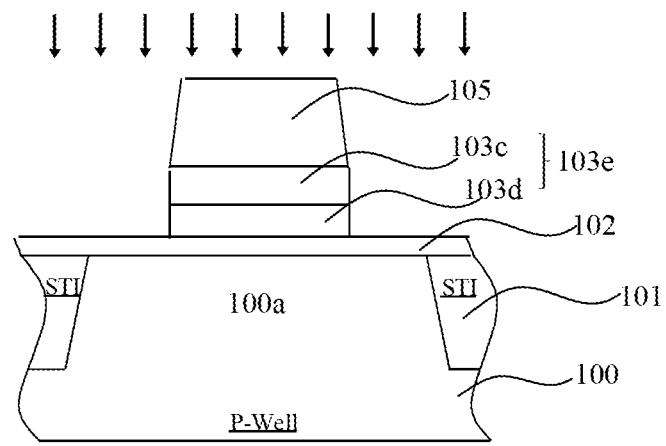

FIG. 8a is a schematic cross-sectional view of a structure resulting from step S4 in the above method taken along line AA' in FIG. 2a, while FIG. 8b is a schematic cross-sectional view of this structure taken along line BB' in FIG. 2a.

Referring to FIGS. 8a and 8b, in step S4, a portion of the polysilicon layer to be processed to form the gate 103e is masked, and the rest thereof is etched away, thereby forming the gate 103e.

Specifically, a second patterned mask layer (photoresist 2) 105 may be formed on the second polysilicon layer 103c as a mask for protecting the portion of the polysilicon layer to be processed to form the gate 103e. The second patterned mask layer 105 may be photoresist or the like.

Subsequently, with the second patterned mask layer 105 serving as a mask, the second polysilicon layer 103c and the first polysilicon layer 103d, out of the masked portion, are etched away by an anisotropic etching process which stops at the gate dielectric layer 102 (at this step, it can be stopped at substrate 100 surface) so as to form the gate 103e. Portions of the active area 100a exposed on two sides of the resulting gate 103e will be subsequently processed to form the source and drain regions of the MOSFET, and the portion of the active area 100a constituting the channel region 100c of the MOSFET is covered by the gate 103e. Additionally, in addition to the channel region 100c, the gate 103e further partially covers the adjacent STI region 101.

After that, the second patterned mask layer 105 may be removed by a process properly selected based on its material.

Figure 9A:
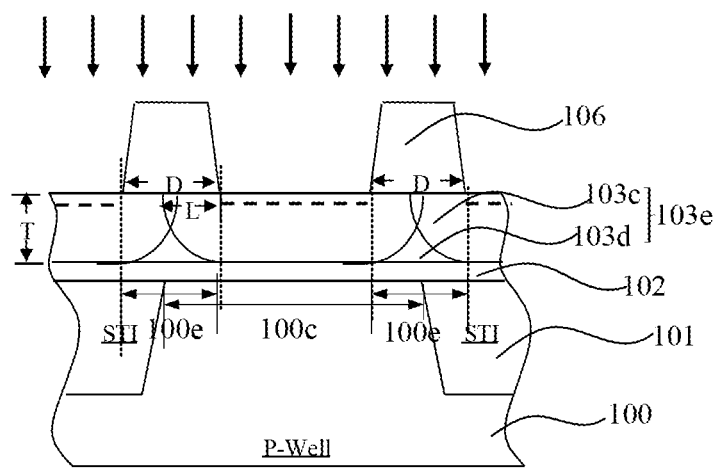
FIGS. 9a and 9b are schematic cross-sectional views of a structure resulting from S/D ion implantation in step S5 in the method taken along lines AA' and BB' in FIG. 2a, respectively.
Figure 9B:
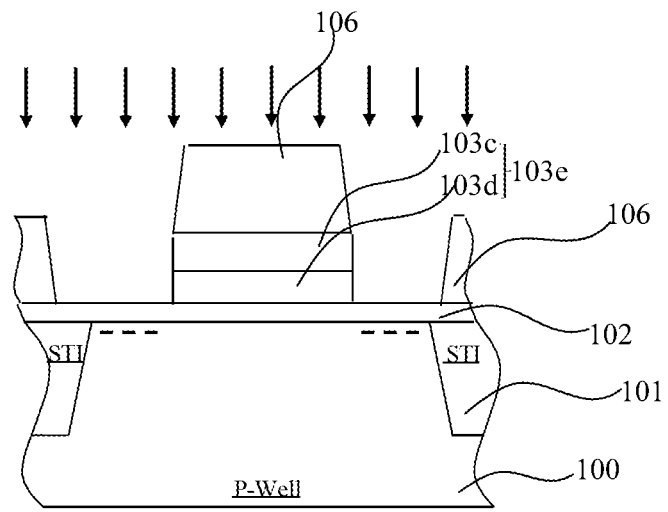

FIG. 9a is a schematic cross-sectional view of a structure resulting from source/drain (S/D) implantation in step S5 in the above method taken along line AA' in FIG. 2a, while FIG. 9b is a schematic cross-sectional view of this structure taken along line BB' in FIG. 2a.

In step S5, the portions of the gate above the channel edge 100e are masked, and ions are implanted on two sides of the gate 103e to form the source and drain regions.

Figure 10A:
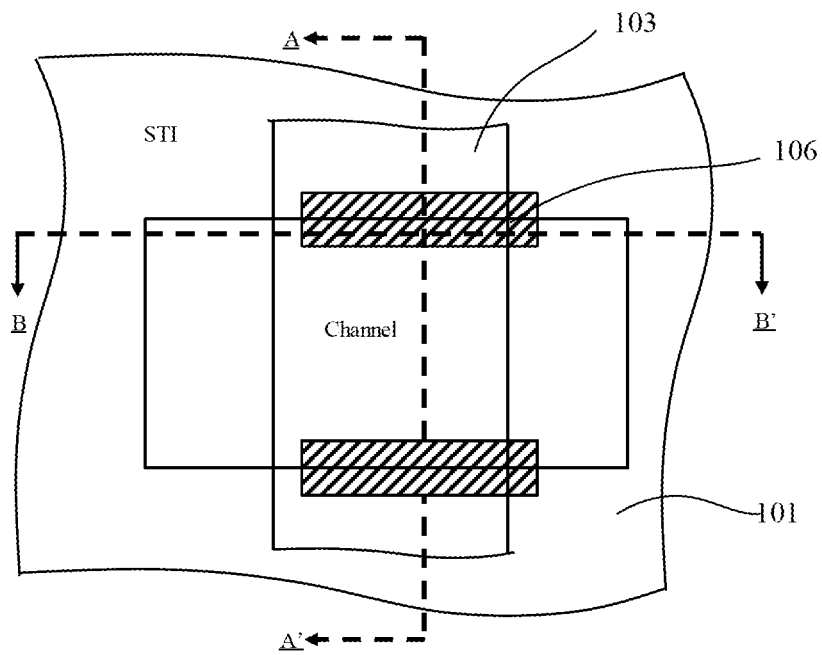
FIG. 10a is a schematic top view of an alternative embodiment (with a mask pattern misaligned with channel edge) of the structure resulting from S/D ion implantation in step S5 in the method.
Figure 10B:
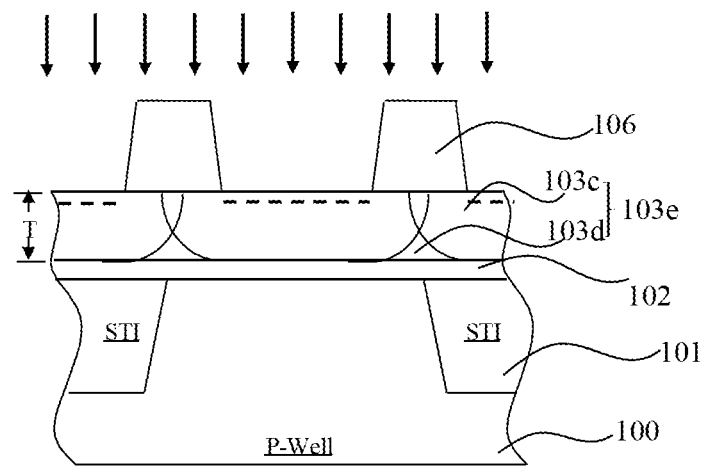
FIGS. 10b and 10c are schematic cross-sectional views of the structure taken along lines AA' and BB' in FIG. 10a, respectively.
Figure 10C:
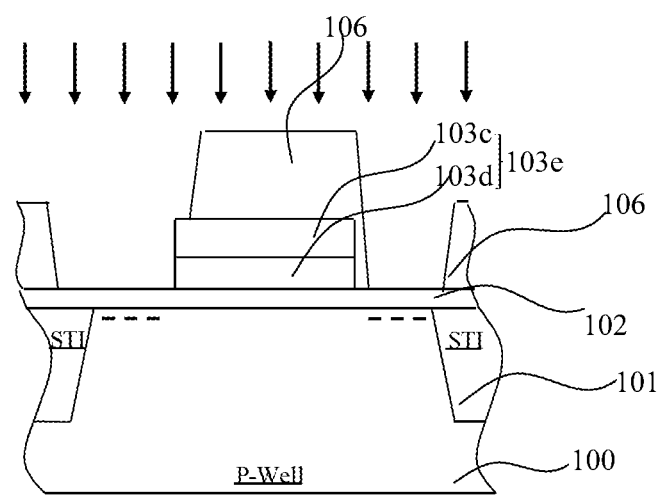
Figure 11A:
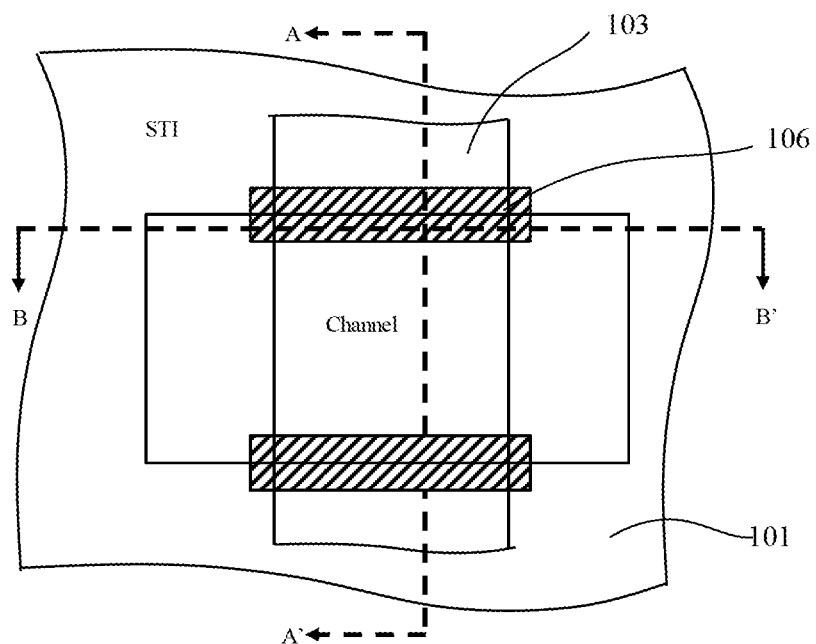
FIG. 11a is a schematic top view of another alternative embodiment (with a mask pattern sized greater than the channel edge) of the structure resulting from S/D ion implantation in step S5 in the method.
Figure 11B:
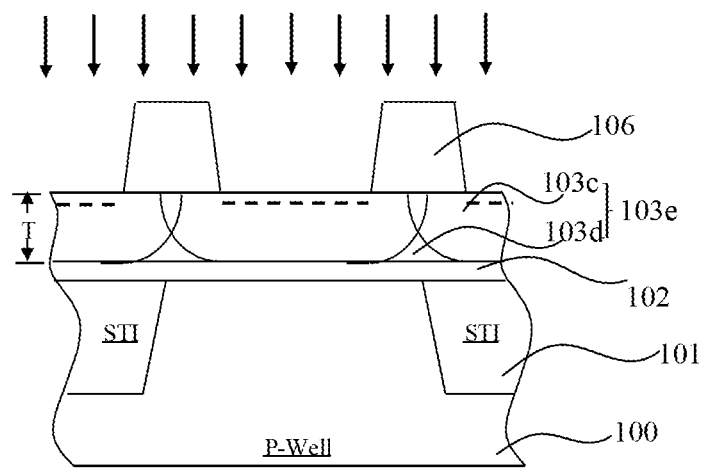
FIGS. 11b and 11c are schematic cross-sectional views of the structure taken along lines AA' and BB' in FIG. 11a, respectively.
Figure 11C:
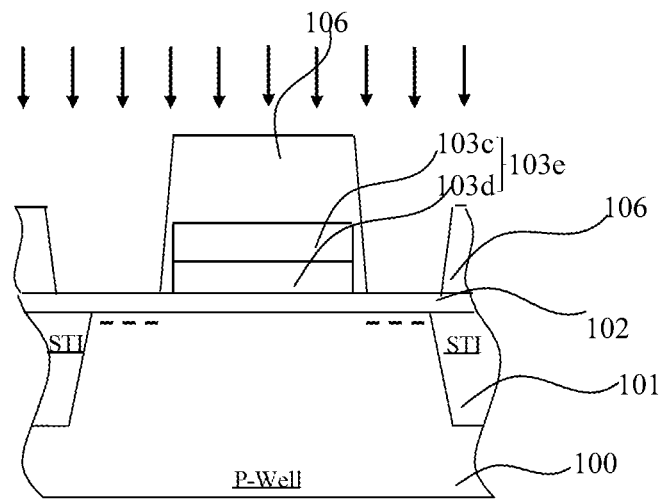

Specifically, referring to FIGS. 9a and 9b, a third patterned mask layer (photoresist 3) 106 may be formed above the gate 103e and the STI region 101 to mask the first polysilicon layers 103d above the channel edge 100e, with the rest of the gate 103e as well as the portions of the active area 100a on opposing sides of the gate remaining exposed. The third patterned mask layer 106 may be photoresist or the like. While the third patterned mask layer 106 is exactly aligned with the channel edge 100e in the configuration of FIG. 9b, in mass production applications, more or less misalignment of the third patterned mask layer 106 is allowed. Referring to FIGS. 10a to 10c, as long as an amount of misalignment of the third patterned mask layer 106 from the portions of the gate 103e is less than 0.8 times the source/drain junction depth, the subsequently formed source and drain regions will not be affected much, and the benefit of a significant improvement in the threshold voltage at the channel edge will still be achievable. In mass production applications, there will be more or less variations in the pattern size of the third patterned mask layer 106, when the pattern size of the third patterned mask layer 106 is relatively small, the subsequently formed source and drain regions will not be significantly affected, and the threshold voltage at the channel edge will still be greatly improved. When the pattern size of the third patterned mask layer 106 is relatively large, with reference to FIGS. 11a to 11c, as long as the an amount of misalignment of the third patterned mask layer 106 on its both sides from the gate 103e does not exceed 0.8 times the source/drain junction depth, the subsequently formed source and drain regions will not be affected much, and the benefit of an significant improvement in the threshold voltage at the channel edge can still be achieved.

After that, referring again to FIGS. 9a and 9b, with the third patterned mask layer 106 functioning as a mask, S/D (source/drain) implantation is performed on the exposed active area 100a and gate 103e. As a result of this S/D implantation, ion-implanted regions will appear in the portions of the active area 100a on two sides of the gate 103e (as indicated by the dashed lines in FIG. 9b) and the second polysilicon layer 103c other than its portions above the channel edge 100e (as indicated by the dashed lines in FIG. 9a). In this embodiment, the S/D implantation may be conducted at an energy level of 10 Kev to 30 KeV and at a dose of $1\times10^{15}/cm^2$ to $5\times10^{15}/cm^2$. In case the MOSFET being fabricated is an N-type MOSFET (or NMOSFET), N-type dopant ions (i.e., ions of the N-conductivity type), including, for example, at least one of phosphorus (P) ions, arsenic (As) ions and antimony (Sb) ions, are implanted in the S/D implantation. When the MOSFET being fabricated is a P-type MOSFET (or PMOSFET), the implanted dopant ions are P-type dopant ions (i.e., ions of the P-conductivity type) including at least one of boron (B) ions, boron fluoride ($BF_2$) ions, gallium (Ga) ions and indium (In) ions.

Figure 12A:
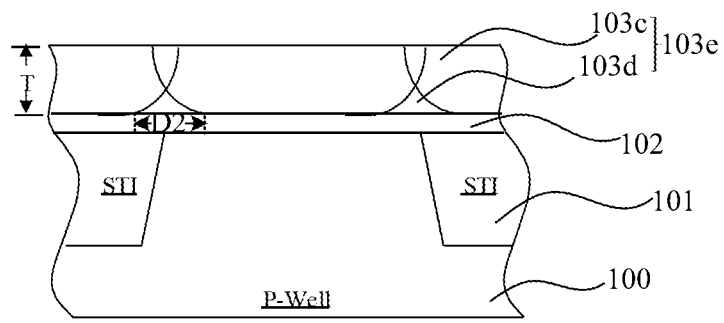
FIGS. 12a and 12b are schematic cross-sectional views of a structure resulting from annealing in step S5 in the method taken along lines AA' and BB' in FIG. 2a, respectively.
Figure 12B:
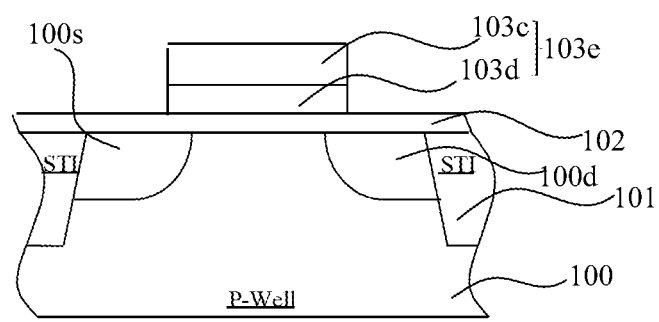

FIGS. 12a and 12b are schematic cross-sectional views of a structure resulting from annealing in step S5 in the above method taken along lines AA' and BB' in FIG. 2a, respectively.

Referring to FIGS. 12a and 12b, the third patterned mask layer 106 may be removed by a process properly selected based on its material.

Thereafter, with continued reference to FIGS. 12a and 12b, the annealing may be accomplished by rapid thermal annealing (RTA) or a similar process, in order to eliminate defects resulting from the S/D implantation and activate the implanted S/D ions. During the annealing, the S/D ions in the ion-implanted regions in the active area 100a on both sides of the gate 103e will diffuse both downward and laterally into the channel region 100c under the gate 103e, thus leading to formation of the source region 100s and the drain region 100d. At the same time, the ions in the ion-implanted region in the second polysilicon layer 103c will diffuse not only down to the interface with the gate dielectric 102 but also laterally into the first polysilicon layers 103d above the channel edge 100e. In other words, the implanted ions in the second polysilicon layer 103c diffuse downward a vertical distance equal to T and diffuse laterally into the first polysilicon layers 103d a horizontal distance L that is equal to 0.8 T. As a result, the laterally diffused regions formed by diffusion of S/D implanted ions in the second polysilicon layer 103c from two sides of the channel edge 100e meet and cross each other inside the channel edge, turning upper portion of the first polysilicon layer 103d over the channel edge into part of the second polysilicon layer 103c containing implanted S/D ions while leaving its lower portion unaffected either by the implanted ions in step S3 or by those in step S5. That is, the second polysilicon layer 103c is doped partially by the implanted ions in step S3 and partially by the implanted ions in step S5. In addition, the width of each remaining portion of the first polysilicon layer 103d is further reduced to D2, and its thickness also experiences a further reduction.

Figure 13A:
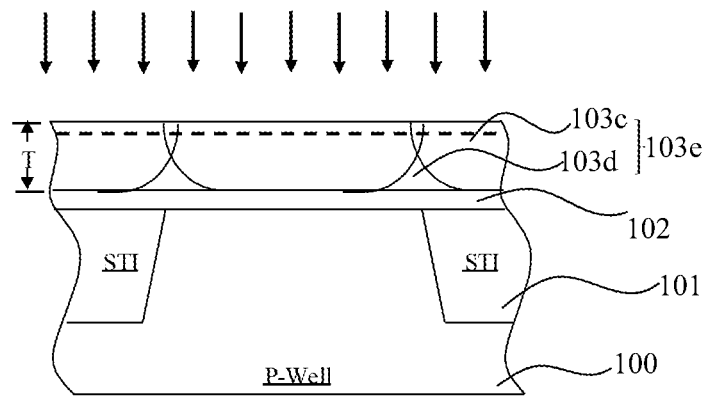
FIGS. 13a and 13b are schematic cross-sectional views of a structure resulting from LDD ion implantation prior to step S5 according to an alternative embodiment of the method taken along lines AA' and BB' in FIG. 2a, respectively.
Figure 13B:
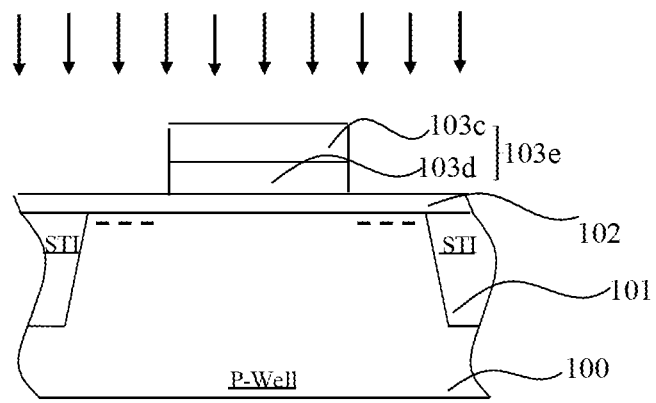
Figure 14A:
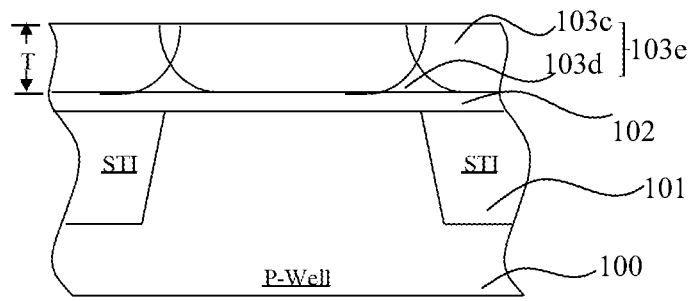
FIGS. 14a and 14b are schematic cross-sectional views of a structure resulting from the formation of spacers subsequent to the LDD ion implantation according to another alternative embodiment of the method taken along lines AA' and BB' in FIG. 2a, respectively.
Figure 14B:
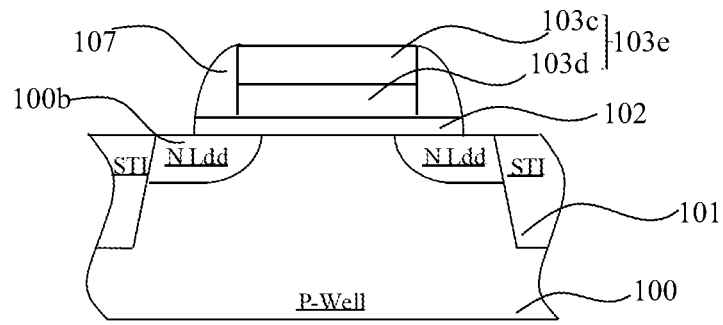
Figure 15A:
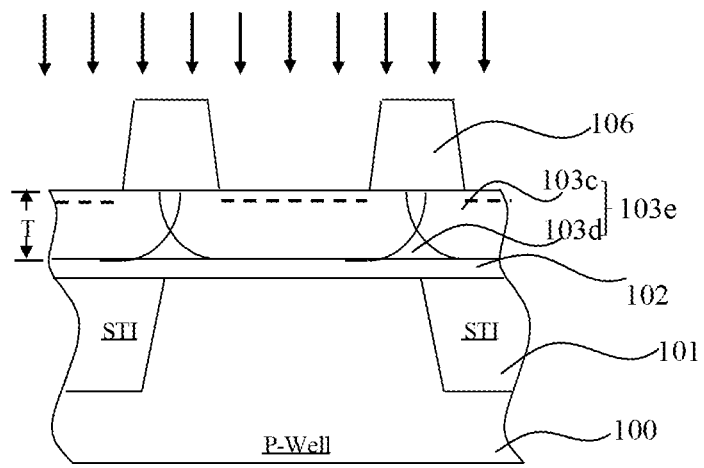
FIGS. 15a and 15b are schematic cross-sectional views of a structure created during step S5 according to another alternative embodiment of the method taken along lines AA' and BB' in FIG. 2a, respectively.
Figure 15B:
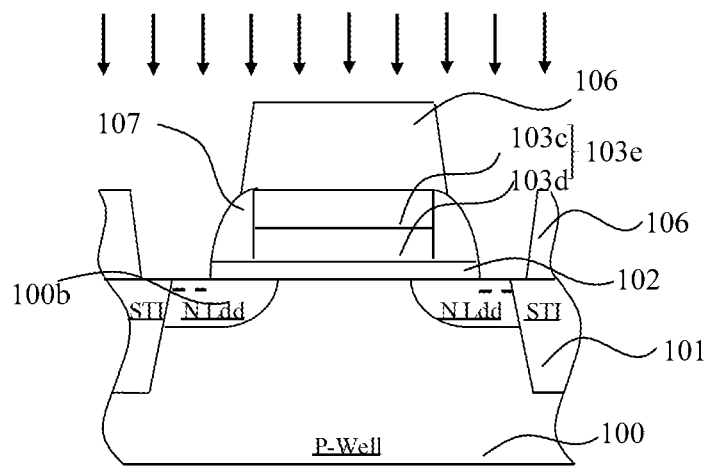

FIG. 13a is a schematic cross-sectional view of a structure resulting during the formation of lightly-doped drain (LDD) regions in the above method taken along line AA' in FIG. 2a, while FIG. 13b is a schematic cross-sectional view of the structure taken along line BB' in FIG. 2a. FIG. 14a is a schematic cross-sectional view of a structure resulting from the formation of spacers in the above method taken along line AA' in FIG. 2a, while FIG. 14b is a schematic cross-sectional view of the structure taken along line BB' in FIG. 2a. FIG. 15a is a schematic cross-sectional view of a structure resulting during step S5 in the above method taken along line AA' in FIG. 2a, while FIG. 15b is a schematic cross-sectional view of the structure taken along line BB' in FIG. 2a.

In other embodiments of the present invention, subsequent to step S4 and prior to step S5, the LDD regions may be formed in the active area 100a on opposing sides of the gate 103e, in order for even better performance of the device to be realized. In addition, subsequent to the formation of the LDD regions and prior to the formation of the source region 100s and the drain region 100d, spacers may be formed on side walls of the gate 103e, in order to ensure both the source region 100s and the drain region 100d to reach a sufficient depth beneath the gate 103e. Further, subsequent to the formation of the source region 100s and the drain region 100d, salicide layers may be formed respectively on the second polysilicon layer 103c, the source region 100s and the drain region 100d, in order to reduce their contact resistances. The formation of the LDD regions, the spacers and the salicide layers will be detailed below.

First of all, LDD implantation may be performed. Specifically, referring to FIGS. 13a and 13b, after the gate 103e is formed and the second patterned mask layer 105 is removed, the LDD implantation may be performed on the gate 103e as well as on exposed portions of the active area 100a on two sides of the gate 103e. The ions of LDD implantation have the same conductivity type as the implanted ions already existing in the second polysilicon layer 103c and hence that of the ions subsequently implanted to form the source region 100s and the drain region 100d. The LDD implantation may be performed at an energy level of 10 KeV to 20 KeV and at a dose of $1\times10^{12}/cm^2$ to $10\times10^{12}/cm^2$. In case the MOSFET being fabricated is an N-type MOSFET (or NMOSFET), N-type dopant ions (i.e., ions of the N-conductivity type), including, for example, at least one of phosphorus (P) ions, arsenic (As) ions and antimony (Sb) ions, are implanted in the LDD implantation. When the MOSFET being fabricated is a P-type MOSFET (or PMOSFET), the implanted dopant ions are P-type dopant ions (i.e., ions of the p-conductivity type) including at least one of boron (B) ions, boron fluoride ($BF_2$) ions, gallium (Ga) ions and indium (In) ions. As a result of the LDD implantation, lightly-doped ion-implanted regions will appear in a surficial portion of the gate 103e (as indicated by the dashed lines in FIG. 13a) and in exposed surficial portions of the active area 100a on both sides of the gate 103e (as indicated by the dashed lines in FIG. 13b).

Next, the implanted ions may be activated by performing an annealing process. Specifically, referring to FIGS. 14a and 14b, rapid thermal anneal (RTA) or a similar process may be performed to anneal the gate 103e and the active area 100a that have been undergoing the aforementioned LDD implantation, in order to eliminate defects resulting from the LDD implantation and activate the implanted ions. This LDD annealing is optional. That is, it may be omitted, leaving the implanted ions to be activated in the annealing process following the subsequent S/D implantation. Namely, the activation of the implanted ions of the LDD may be performed by the annealing process following the subsequent S/D implantation in step S5. When annealed, the implanted ions of the LDD which are implanted into the exposed surficial portions of the active area 100a on both sides of the gate 103e will diffuse and thus form the LDD regions 100b. In case of a shallow LDD implantation depth and a low LDD implantation dose, the ions implanted in the gate 103e may diffuse only within the surficial portion of the second polysilicon layer 103c during the annealing, without affecting the first polysilicon layers 103d above the channel edge 100e. In other words, the LDD implantation only further raises the dopant concentration of the second polysilicon layer 103c and hence the conductivity of the device. In case of a deep LDD implantation depth and a high LDD implantation dose, during the annealing, the ions implanted in the gate 103e will diffuse not only down to the interface with the gate dielectric layer 102 but also laterally into a surficial portion, or the whole, of the first polysilicon layer 103d above the channel edge 100e. In other words, the LDD implantation does not only increase the dopant concentration of the second polysilicon layer 103c but also dopes the surficial portion, or the whole, of each of the first polysilicon layers 103d above the channel edge 100e. As such, each of the first polysilicon layers 103d above the channel edge is, in whole or only in the surficial portion, converted into lightly-doped polysilicon, which can still increase the threshold voltage of the MOSFET at the channel edge and thus improve the device's performance.

After that, the spacers 107 may be formed. Specifically, with continued reference to FIGS. 14a and 14b, a material for forming the spacers, including at least one of silica ($SiO_2$), silicon nitride (SiN) and silicon oxynitride (SiON), may be deposited, by CVD or a similar process, over the entire surface of the substrate 100 with the gate 103e and the LDD regions 100b having been formed thereon or therein. And a dry etching process may then be carried out to etch the deposited material to form the spacers 107 on the lateral sides of the gate 103e. The spacers 107 can define locations where the source and drain regions are to be formed in the subsequent S/D implantation process so as to limit the depth that the ions of the source and drain will be diffused beneath the bottom of the gate 103e. This can ensure that the LDD regions 100b remain after the formation of the source region 100s and the drain region 100d, thus resulting in an additional improvement of the device's performance.

Afterward, the first polysilicon layers 103d above the channel edge 100e may be masked. Specifically, referring to FIGS. 15a and 15b, a third patterned mask layer (photoresist 3) 106 may be formed to mask the first polysilicon layers 103d above the channel edge 100e, leaving the rest of the gate 103e and the portions of the active area 100a on both sides of the gate 103e exposed. The third patterned mask layer 106 may be photoresist or the like. In mass production applications, the third patterned mask layer 106 is allowed to be not only misaligned more or less, but to vary more or less in size. This will not have any significant impact either on the performance of the subsequently formed source and drain regions or on the benefit of an improvement in the threshold voltage at the channel edge.

Next, with continued reference to FIGS. 15a and 15b, with the third patterned mask layer 106 serving as a mask, S/D implantation is performed on the exposed portions of the active area 100a and of the gate 103e. As a result of the S/D implantation, ion-implanted regions will appear in the portions of the active area 100a on opposing sides of the gate 103e (as indicated by the dashed lines in FIG. 15b) and the second polysilicon layer 103c other than its portions above the channel edge 100e (as indicated by the dashed lines in FIG. 15a). In this embodiment, the S/D implantation may be conducted at an energy level of 10 Kev to 30 KeV and at a dose of $1\times10^{15}/cm^2$ to $5\times10^{15}/cm^2$. In case the MOSFET being fabricated is an N-type MOSFET (or NMOSFET), N-type ions (i.e., ions of the N-conductivity type), including, for example, at least one of phosphorus (P) ions, arsenic (As) ions and antimony (Sb) ions, are implanted in the S/D implantation. When the MOSFET being fabricated is a P-type MOSFET (or PMOSFET), the implanted ions are P-type dopant ions (i.e., ions of the P-conductivity type) including at least one of boron (B) ions, boron fluoride ($BF_2$) ions, gallium (Ga) ions and indium (In) ions.

The third patterned mask layer 106 may then be removed. Specifically, referring to FIGS. 16a and 16b, the third patterned mask layer 106 may be removed by a process properly selected based on its material.

Next, the implanted ions may be activated by annealing. Specifically, referring to FIGS. 16a and 16b, the annealing may be accomplished by rapid thermal annealing (RTA) or a similar process, in order to eliminate defects resulting from the S/D implantation and activate the implanted S/D ions. During the annealing, the implanted ions in the ion-implanted regions in the active area 100a on both sides of the gate 103e will diffuse both downward and laterally into the channel region 100c under the gate 103e, thus leading to formation of the source region 100s and the drain region 100d. At the same time, the implanted ions in the ion-implanted region in the second polysilicon layer 103c will diffuse not only down to the interface with the gate dielectric 102 but also laterally into the first polysilicon layers 103d above the channel edge 100e. In other words, the implanted ions in the second polysilicon layer 103c diffuse downward a vertical distance equal to T and diffuse laterally into the first polysilicon layers 103d a horizontal distance L that is equal to 0.8 T. As a result, the diffused regions formed by laterally diffusion of the implanted S/D ions in the second polysilicon layers 103c from both sides of the channel edge 100e meet and cross each other within the channel edge 100e, turning an upper portion of the first polysilicon layer 103d into the second polysilicon layer 103c which contains implanted S/D ions, while leaving its lower portion unaffected either by the implanted ions in step S3 or by those in step S5. That is, the second polysilicon layer 103c is doped partially by the ions in step S3 and partially by the ions in step S5. In addition, the width of the first polysilicon layers 103d is further reduced to D2, and their thickness also experiences a further reduction. At this point, the structure of the gate 103e composed of the second polysilicon layer 103c and the first polysilicon layers 103d is final, with the ions in the second polysilicon layer 103c including those implanted in step S3, the LDD implantation and the S/D implantation. In other words, the concentration (or dose) of the implanted ions in the second polysilicon layer 103c is equal to the sum of the doses in step S3, the LDD implantation and the S/D implantation and is $1.5\times10^{15}/cm^2$ to $10\times10^{15}/cm^2$ in this embodiment.

Subsequently, the salicide layers are formed. Specifically, referring to FIGS. 16a and 16b, a salicide process may be carried out to form the salicide layers 108 respectively on the gate 103e, the source region 100s and the drain region 100d. The salicide process may include: forming a metal layer (including, for example, at least one of nickel (Ni), cobalt (Co), tungsten (W), platinum (Pt), manganese (Mn), titanium (Ti) and tantalum (Ta)) over the substrate 100 so that it covers the surfaces of the gate 103e, the source region 100s and the drain region 100d; and thermally annealing the metal layer so that metal atoms (M) therein react with silicon (Si) atoms on the surfaces of the gate 103e, the source region 100s and the drain region 100d to result in the salicide layers (MSix) 108. These salicide layers 108 can lower contact resistances of the gate 103e, the source region 100s and the drain region 100d with the subsequent formed respective conductive contact plugs, which is favorable to the performance of the device.

As discussed above, in the MOSFET fabrication method of the present invention, after the gate is formed by etching the deposited undoped or lightly-doped polysilicon layer, with the portions of the polysilicon gate above the channel edge in the substrate being protected, the S/D implantation is performed on the rest gate portion to form the source and drain regions. In this way, each of the gate portions above the channel edge is constructed of the doped second polysilicon layer stacked with a corresponding one of the undoped (or lightly-doped) first polysilicon layers, while the rest gate portion is simply constituted by the doped second polysilicon layer. Therefore, the threshold voltage of the MOSFET at the channel edge (i.e., the channel edge) can be increased simply by the gate portions above the channel edge, without needing either structural changes in the STI region or additional features. As the method does not involve counterdoping the polysilicon, a masking step necessary for the counterdoping can be saved. In addition, the method can accommodate relatively large misalignment and size variations in used mask patterns, thus avoiding forming an undesired PN junction around the source or drain region due to misalignment. This significantly reduces the process complexity and requirements on alignment accuracy and enhances the reliability of the resulting device. Further, the solution of the present invention allows easy fabrication at low cost because it only requires modifying the conventional masks for polysilicon implantation and S/D implantation, without needing any additional mask.

Accordingly, in order to enable the implementation of the MOSFET and the method as defined above, the present invention also provides a method for modifying the conventional mask for polysilicon implantation and such a modified mask. This mask is used for the ion implantation in step S2 in the method of the present invention. Referring to FIGS. 6a and 6b, the mask has features for protecting the polysilicon layers 103 above the channel edge 100e and an opening surrounding the features and exposing therein the polysilicon layer 103 other than the portions above the channel edge 100e. Referring to FIGS. 2a to 2c, the mask may also be used for the fabrication and protection of the first polysilicon layers 103d in the MOSFET of the present invention. In this case, the features of the mask protect the first polysilicon layers 103d, while the portion of the gate other than the first polysilicon layers 103d is exposed in the opening.

The present invention also provides a method for modifying the conventional mask for S/D implantation and such a modified mask. This mask is used for the S/D implantation in step S5 in the method of the present invention. Referring to FIGS. 9a and 9b, the mask has features for protecting the portions of the gate 103e above the channel edge 100e and openings surrounding the features and exposing therein the gate 103e other than the portions above the channel edge 100e and the portions of the active area in which the source region 100s and the drain region 100d are to be formed. The mask may also be used for forming the source region 100s and the drain region 100d in the MOSFET of the present invention. Referring to FIGS. 2a to 2c, in this case, the features of the mask protect the first polysilicon layers 103d, while the openings are aligned with, and expose therein, the source region 100s, drain region 100d and the gate other than the portions above the first polysilicon layers 103d. Compared to the conventional masks, those according to the present invention can ensure the formation of the first polysilicon layers in the gate of the MOSFET above the channel edge by simply adding the aforementioned protective features. This allows the modification and fabrication to be achieved at low cost.

The description presented above is merely that of a preferred embodiment of the present invention and does not limit the scope thereof in any sense. Any and all changes and modifications made by those of ordinary skill in the art in light of the above teachings fall within the scope as defined in the appended claims.

What is claimed is:

1. A metal-oxide-semiconductor field-effect transistor (MOSFET), comprising:
   a substrate;
   a shallow trench isolation (STI) region formed in the substrate;
   an active area, formed in the substrate and delimited by the STI region, the active area comprising a source region, a drain region and a channel region located between the source and drain regions; and
   a gate formed over the channel region, the gate comprising a first polysilicon layer and a second polysilicon layer, the first polysilicon layer being a layer of lightly-doped polysilicon, the first polysilicon layer covering a channel edge between the channel region and the STI region such that the first polysilicon layer covers a first portion of the channel region and a part of the STI region without completely covering the channel region, the second polysilicon layer being a layer of doped polysilicon that covers the first polysilicon layer and a second portion of the channel region not covered by the first polysilicon layer, the lightly-doped polysilicon being implanted with ions of a same conductivity type as ions implanted in the second polysilicon layer and in the source and drain regions, and the lightly-doped polysilicon being implanted with the ions of a concentration lower than that of the ions implanted in the second polysilicon layer.

2. The MOSFET of claim 1, wherein the channel edge has a width ranging from 0.8 T to 1.6 T, where T denotes a total deposition thickness of the polysilicon layers in the gate.

3. The MOSFET of claim 1, wherein the gate is isolated from the channel region by a gate dielectric layer.

4. The MOSFET of claim 1, wherein the substrate is provided with lightly-doped drain (LDD) regions situated on sides of the source and drain regions proximate to the channel region.

5. The MOSFET of claim 1, wherein metal silicide layers are formed on respective surfaces of the gate, the source region and the drain region.

* * * * *